Figure 1:
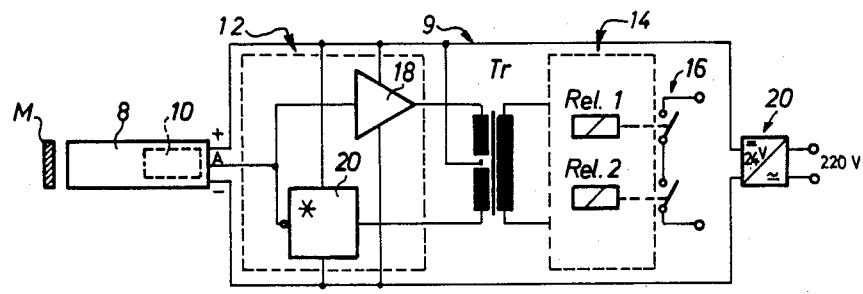

United States Patent [19]

Kammerer et al.

[11] Patent Number: 4,492,925
[45] Date of Patent: Jan. 8, 1985

[54] TESTING AND EVALUATING CIRCUIT FOR PROXIMITY SWITCHES IN MACHINE CONTROL MEANS

[75] Inventors: Heinz Kammerer, Ostfildern; Hans Langheinrich, Leonberg-Silberberg, both of Fed. Rep. of Germany

[73] Assignee: Gebhard Balluff Fabrik feinmechanischer Erzeugnisse GmbH & Co., Neuhausen, Fed. Rep. of Germany

[21] Appl. No.: 352,804

[22] Filed: Feb. 26, 1982

[30] Foreign Application Priority Data

Mar. 18, 1981 [DE] Fed. Rep. of Germany ....... 3110390

[51] Int. Cl.³ .................... G01R 31/02; G01R 31/32
[52] U.S. Cl. .................... 324/418; 324/207; 324/415
[58] Field of Search ............ 324/415, 418, 202, 207, 324/208, 78 N, 419, 422, 423; 340/514–516

[56] References Cited

U.S. PATENT DOCUMENTS

| | | | |
|---|---|---|---|
| 4,270,715 | 6/1981 | Norton et al. | 246/5 |
| 4,305,556 | 12/1981 | Norton et al. | 246/5 |
| 4,323,890 | 4/1982 | Lemke | 246/5 |
| 4,384,251 | 5/1983 | Schelling et al. | 324/207 |

*Primary Examiner*—Michael J. Tokar
*Assistant Examiner*—Kevin D. O'Shea

[57] ABSTRACT

The invention relates to a testing and evaluating circuit for a proximity switch suitable for testing and provided as an element of a machine control means; associated with the proximity switch is a control circuit, by which the proximity switch is alternately switchable between its two operating conditions to generate a timed output signal with a given frequency, an evaluating circuit being provided, by which a clear signal indicating fault-free operation is producable for the duration of a timed output signal from the proximity switch and by which a blocking signal for the machine control means, indicating a fault, is producable in the absence of changes in the potential of the output signal from the proximity switch. The evaluating circuit preferably comprises a relay circuit, to which the output signal from the proximity switch or a signal derived from this is fed via a transformer.

13 Claims, 5 Drawing Figures

TESTING AND EVALUATING CIRCUIT FOR PROXIMITY SWITCHES IN MACHINE CONTROL MEANS

The invention relates to a testing and evaluating circuit for a proximity switch suitable for testing and provided as an electric element of a machine control means.

It has already been proposed that proximity switches, which can be tested as to their correct functioning, be used as elements of machine control means for the monitoring of movable elements, these switches being especially inductive or capacitive proximity switches, with which an electrically and periodically switchable damping circuit is provided to test for correct functioning, an oscillator, which contains an inductive or capacitive control element, being dampable by this damping circuit. This was based on the assumption that the damping circuit, in the simplest case, consisted essentially of a keying device, via which a portion of the coil of an inductive proximity switch may be short-circuited, wherein allowance was also made for actuating the damping circuit periodically in order to be able to carry out, at certain intervals, a testing of the proximity switch as to its correct functioning.

Although a considerable margin of safety against unexpected faults may be achieved in accordance with the earlier proposal it has been found that the solution previously suggested is not completely satisfactory in all cases.

The object underlying the invention was therefore, proceeding on the basis of the earlier proposal, to provide an improved testing and evaluating circuit for proximity switches suitable for testing, which allows a continuous monitoring of the trouble-free operation of the proximity switch itself and the elements of the testing and evaluating circuit.

In the case of a testing and evaluating circuit of the type mentioned at the beginning this object is accomplished according to the invention in that a control circuit is provided, by which the proximity switch is alternately switchable between its two operating conditions to generate a timed output signal in a given frequency, and that an evaluating circuit is provided, by which a clear signal is producable for the duration of a timed output signal from the proximity switch and a blocking signal for the machine control means is producable in the absence of changes in the potential of the output signal from the proximity switch.

The decisive advantage of such a testing and evaluating circuit comprising a control circuit operating at a given frequency is that for example with inductive and capacitive proximity switches the damping of the oscillator may take place at a relatively high frequency so that an alternating voltage is constantly available at the output of the proximity switch as long as no damping of the proximity switch by a movable element takes place and as long as no interruption occurs. The possibility is hereby offered in the construction of the invention of feeding the output signal from the proximity switch, which is in the form of an alternating voltage or a square-wave pulse sequence and which may be obtained in the case of an optical proximity switch, for example, by timed circuit-connecting and circuit-breaking of a light transmitter of the proximity switch, via a transformer to electric monitoring means connected to its output side wherein the mere fact that a continuous signal is transmitted via the transformer indicates that the proximity switch positioned before the transformer with its associate astable multivibrator is functioning perfectly.

In the case of a proximity switch according to the invention, which has, as known per se, an inductive feeler head containing a feeler coil in the tank circuit of the oscillator, it has proven advantageous if a short-circuiting of at least a portion of the feeler coil is initiated in the one switching position of the multivibrator; it is particularly advantageous in the case of a feeler coil with a tab when a short-circuiting of a coil portion of the feeler coil is initiated by the multivibrator, the coil portion lying between the tab and one of the outer connections.

In the case of such a design for the proximity switch it is then particularly advantageous for a short-circuiting of the feeler coil or its coil portion to be directly initiated by a switching transistor connected in parallel thereto and adapted to be controlled by the multivibrator. In this respect it is particularly favourable to have a predetermined series resistor inserted in the short-circuiting path.

As already mentioned it is also advantageous with respect to this form of the invention to have the output side of the proximity switch connected with the input side of an actuating circuit, the output side of which is connected via a transformer to the input side of a relay circuit, which contains two relays as elements of a machine starting control circuit, these relays each having a normally open contact, and to have the normally open contacts connected in series to each other into the main contact path of the machine current circuit.

Figure 5:
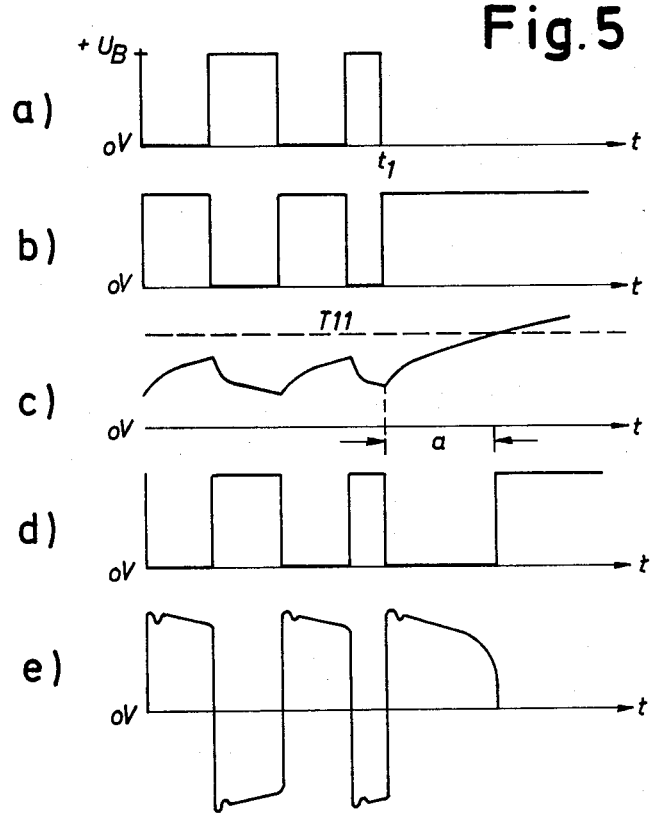
Figure 2:
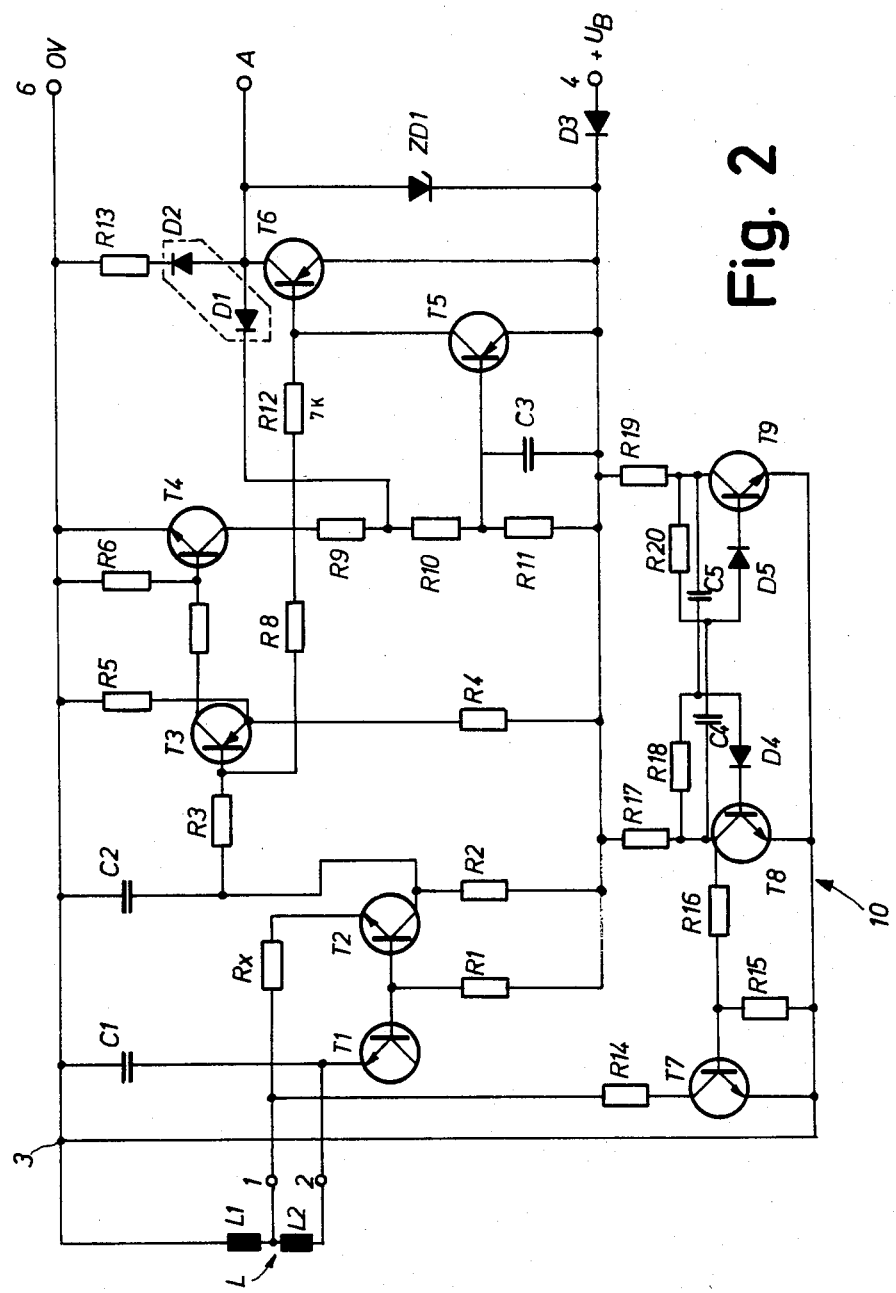
Figure 3:
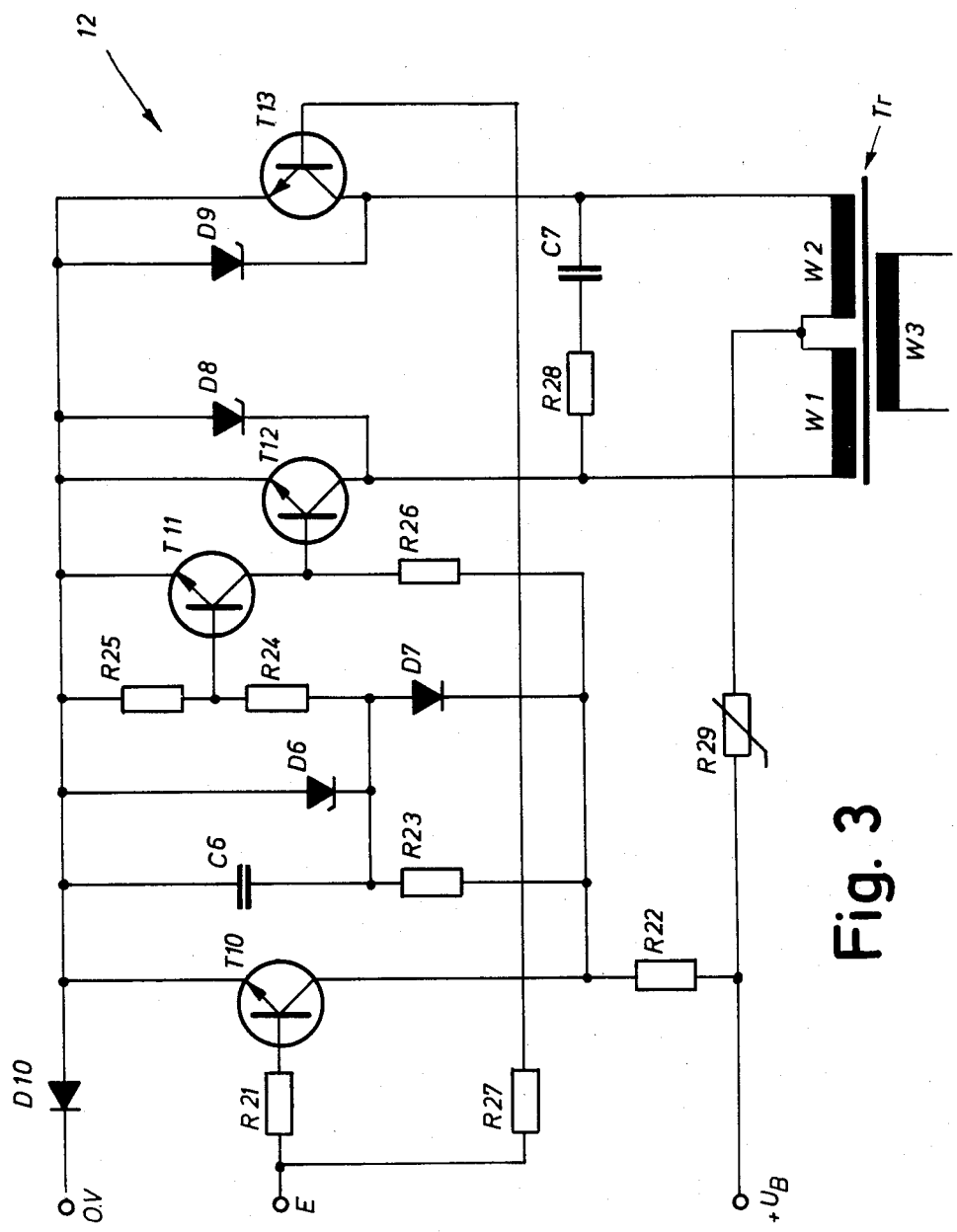
Figure 4:
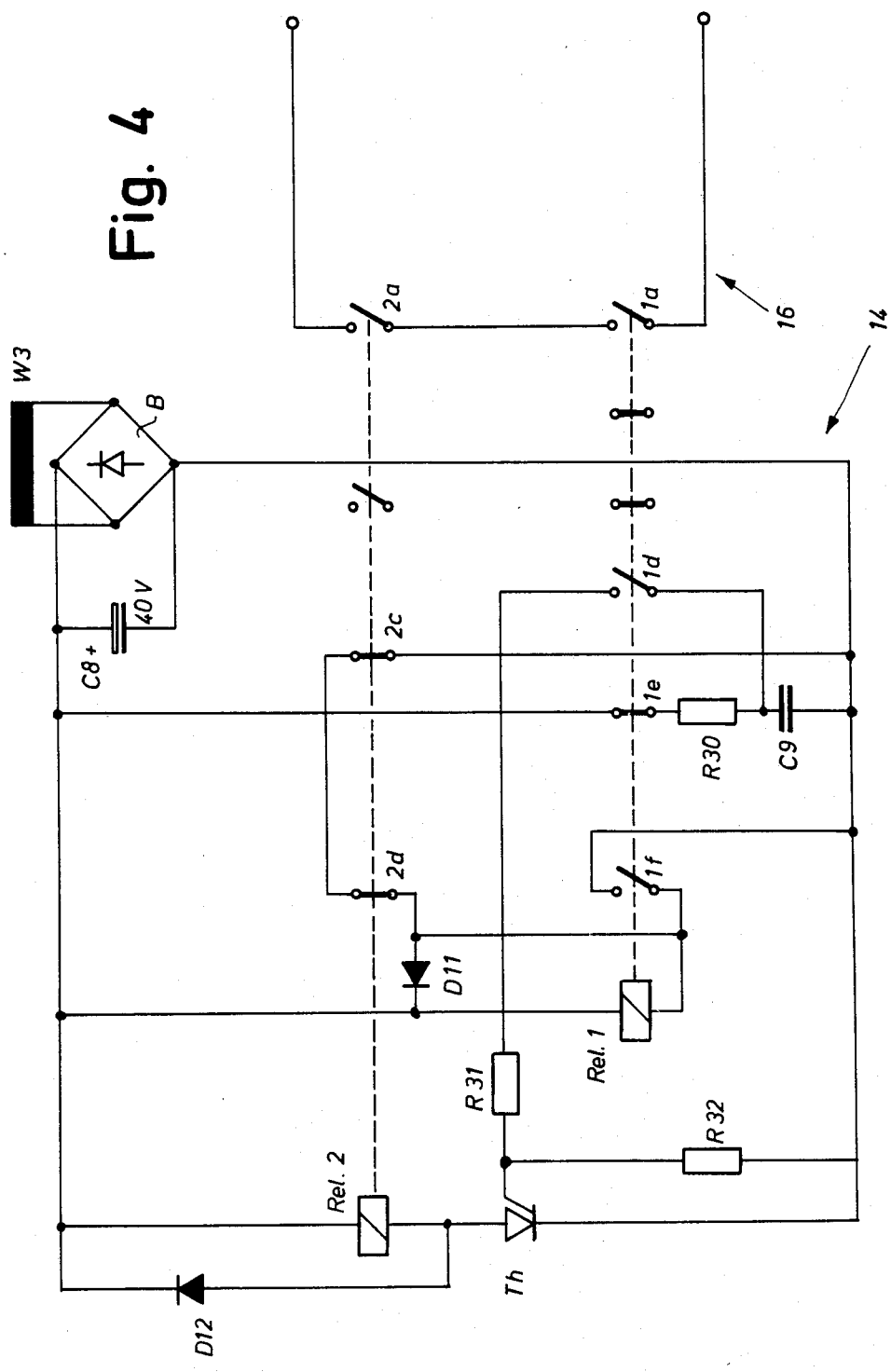

Additional details and advantages of the invention are explained in detail in the following on the basis of drawings and/or are the subject matter of subclaims. The drawings show:

FIG. 1 a basic circuit diagram of a preferred embodiment of a testing and evaluating circuit according to the invention;

FIG. 2 a detailed circuit diagram of the proximity switch of the circuit according to FIG. 1 with a control circuit and a damping circuit;

FIG. 3 a detailed circuit diagram of an actuating circuit of the circuit according to FIG. 1;

FIG. 4 a detailed circuit diagram of a relay circuit of the circuit according to FIG. 1 and FIG. 5 a diagram with the potential variations at several important points of the actuating circuit according to FIG. 3.

FIG. 1 shows a proximity switch 8 capable of being tested, into which, according to the embodiment and as shown by a block drawn in with a dashed line, a control circuit 10 is integrated, by which a damping circuit of the proximity switch 8 may be periodically switched in or out.

The proximity switch 8 has an output A connected to the input of an actuating circuit 12, which, according to the embodiment, is constructed of an amplifier 18 and an inverter amplifier 20. The inverter amplifier 20 is rendered non-conductive when the proximity switch 8 malfunctions or is damped in the case of a first output potential from the proximity switch 8 just as the first amplifier 18 is rendered non-conductive in the case of a second potential at output A of the proximity switch 8. The outputs from the two amplifiers 18, 20 are connected to a transformer Tr, the primary coil of which is designed in the case of the embodiment according to FIG. 1 as a coil with a central tab. The secondary coil of transformer Tr is connected to the input to a relay circuit 14, which has two relays Rel 1 and Rel 2 as essential elements, the relays each having a normally open contact inserted into the main contact circuit 16 of a machine control means as will be explained in detail later on the basis of FIG. 4. Altogether, the circuits or circuit portions connected to the output A from the proximity switch 8 in FIG. 1 form an evaluating circuit 9, with which a power supply or main unit 20 is associated, from which the proximity switch 8 itself is also supplied.

As FIG. 2 of the drawings shows the proximity switch to be tested according to the invention is in the first place a largely standard, inductive proximity switch. This proximity switch has at its input a feeler coil (L), which is normally disposed in a cup core open towards the front—i.e. in the direction of the movable parts to be monitored. The feeler coil L has outer connections 2, 3 connected to the supply connection 6 of the proximity switch or to the emitter of transistor T 1. Parallel to the feeler coil L is a capacitor C 1, which forms, together with the feeler coil L, an oscillatory circuit L, C 1.

The oscillator of the proximity switch 8 according to FIG. 2 also has two transistors T 1 and T 2 and three resistors Rx, R 1 and R 2. The base connections of transistors T 1 and T 2 are connected via resistor R 1 with connection 4 of the proximity switch. The emitter of transistor T 1 is connected on the one hand with the outer connection 2 of feeler coil L and on the other hand with capacitor C 1. The collector of transistor T 1 is left unconnected so that merely the base-emitter circuit of transistor T 1 is operative as a diode; the electrical properties of this diode can, however, be matched very exactly to the properties of transistor T 2, the collector of which is connected via resistor R 2 to connection 4 and the emitter of which is connected via resistor Rx to connection 1 of the proximity switch 8, i.e. to a tab of feeler coil L which is subdivided by this tab into two coil portions L 1 and L 2.

A trigger circuit is connected to the oscillator described above, this trigger circuit having a capacitor C 2, resistors R 3 to R 11 and two further transistors T 3 and T 4; the capacitor C 2 is also to be regarded as an integral part of the oscillator.

Of the above-mentioned component elements the capacitor C 2 is connected on the one hand to connection 6 of the proximity switch and on the other hand to the collector of transistor T 2. The common connection point for transistor T 2, resistor R 2 and capacitor C 2 is connected via a resistor R 3 to the base of transistor T 3 of the trigger circuit. The emitter of transistor T 3, which is designed as a pnp transistor, is connected on the one hand via resistor R 4 with connection 4 and on the other hand via resistor R 5 with connection 6 of the proximity switch. The collector of transistor T 3 is connected via resistor R 7 with the base of transistor T 4. The base of transistor T 4 is also connected via resistor R 6 to connection 6 whereas the emitter of transistor T 4 is directly connected to connection 6. The collector of transistor T 4 is connected via resistor R 8 to the base of transistor T 3 and via resistors R 9 to R 11 to connection 4 and forms a connection, which forms the output A of the trigger circuit or the input of the actuating circuit 12 connected thereto.

In the case of a proximity switch of the type described above the feeler coil L is normally disposed in a pot core open towards the front so that a magnetic field, which is widely spread, is created.

If a metal element M is moved into this field induced eddy currents circulate within it, these extracting energy from the field. These eddy-current losses cause a deterioration in the Q factor of the oscillating circuit so that the amplitude of oscillation is reduced. The oscillating circuit is, in other words, damped.

If the oscillating circuit or rather the oscillator oscillates the elements R 2, T 2, Rx and L 1 form a voltage divider for the duration of the negative half wave of the oscillation. This causes a relatively high negative voltage at the collector of transistor T 2 as the resistor R 2 is highly resistive in comparison with the remaining elements of the voltage divider. This results in the capacitor C 2 being only slightly charged at the input to the trigger circuit. If transistor T 2 is rendered non-conductive during the positive half wave of the oscillation capacitor C 2 will be discharged again slightly via resistor R 2 until the next negative half wave of the oscillation occurs. Capacitor C 2 therefore stabilizes the voltage at the collector of transistor T 2 or at the input to the trigger circuit such that a direct voltage with negligible residual ripple results. This voltage is so high or brought so close to 0V that the transistor T 3 is switched into the conductive state so that subsequently transistor T 4 and a transistor T 6 connected to its collector via a resistor R 12 are switched to the conductive state. Since the emitter of transistor T 6 is connected via a diode D 3 to connection 4 a positive potential ($+U_B$) results, in comparison with connection 6, at the output A of the proximity switch, i.e. at the collector of transistor T 6. A Zener diode ZD 1 parallel to transistor T 6 protects this transistor and limits static peaks.

Parallel to the base-emitter circuit of transistor T 6 is a further transistor T 5, the base of which is connected to the common connection point of resistors R 10 and R 11, which lie in series with resistor R 9 between the collector of transistor T 4 and connection 4 of the proximity switch 8. The common connection point of resistors R 9 and R 10 is thereby connected via diode D 1 to the collector of transistor T 6, which is also connected to connection 6 via the series connection of a further diode D 2 and resistor R 13.

If the amplitude of oscillation decreases due to damping of the oscillator capacitor C 2 will be charged to a higher voltage, the level necessary to trigger the trigger circuit into an "off" position being exceeded. In this situation the emitter potential of transistor T 3 is essentially determined by resistors R 4 and R 5 in such a way that the cut-in or cut-out threshold essentially corresponds to the emitter potential when the drop in voltage at R 3 as well as the base-emitter voltage $U_{BE}$ are disregarded. Transistor T 3 is therefore rendered non-conductive by the rise in voltage at capacitor C 2; the succeeding transistors T 4 and T 6 are thereby also rendered non-conductive since they are no longer supplied with base current. The level of the output signal at output A of the proximity switch 8 thereby practically sinks to the value of 0V (0 volts).

If a proximity switch of the type considered, with which resistor Rx serves to set the individual activation distance between the active surface of the feeler head and the movable element to be monitored, is used to monitor the safety devices on machines a defect could have disastrous consequences. It is not, however, possible for any damage to be done if a damping is simulated and a relay controlled by the proximity switch drops out since in this case a machine fault is being simulated and the machine cannot start or is switched off. If, however, oscillation is simulated despite damping actually taking place, which is, for example, the case if one of the transistors T 3, T 4 or T 6 has been deleted, the machine can still start despite the fault; this could lead to severe damage to the machine or even injury to personnel. For this reason it has already been suggested that a damping circuit be associated with the proximity switch 8 or its oscillator; a damping of the oscillator could then take place, if necessary periodically, for the purposes of testing whether such a damping actually results in a change in the signal at the output of the proximity switch, such a change in signal showing the correct functioning of the proximity switch.

It has, however, been shown that such a periodic damping is not sufficiently reliable in some cases and that a continuous monitoring of the correct functioning of the proximity switch is desirable. In order to make such continuous testing possible a control circuit 10 is now associated, according to the invention, with the proximity switch 8. This control circuit may be integrated into the proximity switch itself but may also be combined with the other elements of the testing and evaluating circuit according to the invention at a distance from the actual proximity switch.

In the case of the embodiment the control circuit is constructed as an astable multivibrator 10. As FIG. 2 shows this astable multivibrator consists of resistors R 17 to R 20, capacitors C 4 and C 5 and transistors T 8, T 9 and of diodes D 4 and D 5. On the basis of the construction of the circuit shown in FIG. 2 it is ensured that the multivibrator 10 will start to oscillate reliably when the operating potential is switched on; the diodes D 4 and D 5 serve to protect the base connections of transistors T8, T 9 against negative voltage peaks as they occur at the moment of switching over.

In the case of the multivibrator 10 according to FIG. 2 the collector of transistor T 8 forms the output of the circuit, via which the actual damping circuit with transistor T 7 and the resistor R 14 connected in series thereto may be controlled; this series connection consisting of resistor R 14 and transistor T 7 is parallel to the feel head connections 1 and 3 and therefore to the coil portion L 1, which may therefore be short-circuited. This short-circuiting of the coil portion L 1 takes place for example at a timed frequency of 140 Hz and simulates a damping of the oscillator of the proximity switch 8, at the output A of which a timed or a dynamic output signal is therefore available.

According to FIG. 3 the output signal of the proximity switch 8 is fed to the actuating circuit 12 at its input E, which is connected to the base of transistor T 10 via a resistor R 21 and to the base of transistor T 13 via a resistor R 27. The emitters of transistors T 10 and T 13 are connected via a diode D 10 to one supply voltage connection (OV) of the actuating circuit. The collector of transistor T 10 is connected to the other supply voltage connection $+U_B$ via a resistor R 22.and also via a PTC resistor to the central tab of tranformer Tr, via which the actuating circuit 12 is inductively connected to the relay circuit 14 according to FIG. 4. Due to the central tab the primary side of the transformer is divided into coil portions w 1 and w 2. The connections of these coil portions facing away from the central tab are connected on the one hand to the collector of transistor T 13 and on the other to the collector of a further transistor T 12. The emitters of transistors T 12, T 13 are again connected to the first connection (OV). A Zener diode D 8 or D 9 is parallel to each collector-emitter circuit of transistors T 12, T 13 while the collectors of these transistors are connected via the series connection of a resistor R 28 and a capacitor C 7. The base of transistor T 12 is connected on the one hand to the collector of transistor T 10 via a resistor R 26 and on the other hand with the collector of a further transmitter T 11, the emitter of which is connected to the first connection (OV) of the actuating circuit 12. The base of transistor T 11 is also connected to this connection via a resistor R 25 which is connected in series with a resistor R 24. Parallel to the series connection of resistors R 24 and R 25 is a further Zener diode D 6 as well as a capacitor C 6. The common connection point of capacitor C 6, Zener diode D 6 and resistor R 24 is connected via the parallel connection of a resistor R 23 and a diode D 7 to the collector of transistor T 10. The actuating circuit shown in FIG. 3 operates as follows:

The timed signal from the proximity switch 8, which, according to FIG. 5a is a rectangular pulse sequence with a lower level at about OV and an upper level at about $+U_B$, divides at input E of the actuating circuit 12 and is fed on the one hand via resistor R 27 to the base of transistor T 13 and on the other hand via the inverter comprising transistor T 10 to the base of transistor T 12.

If the signal is at its low level (OV) transistor T 10 is rendered non-conductive while transistor T 12 may be fed with base current via resistors R 22 and R 26 and is therefore switched into the conductive state. A current then flows from the positive connecting terminal $(+U_B)$ via the PTC resistor R 29 through the coil portion w 1 of transformer Tr and via the conductive transistor T 12 to the other connection (OV) of the circuit.

When the output signal of proximity switch 8 then jumps to the high level $(+U_B)$ the transistors T 10 and T 13 are switched into the conductive state while transistor T 12 is rendered non-conductive. Current now flows from the positive connecting terminal $+U_B$ via the PTC resistor R 29 through the coil portion w 2 and the transistor T 13 to the other connection of the circuit. The coil portions w 1 and w 2 of the primary coil of transformer Tr therefore have current flowing through them alternately in accordance with the change in the switching conditions of transistors T 12 and T 13. Since the central tab of the primary coil is connected to the positive connection of the circuit a magnetic flow results when the two coil portions w 1 and w 2 are wound in the same direction, this magnetic flux having a positive or negative direction according to the current path just switched in. A zero-symmetrical, almost square-wave alternating voltage thereby occurs on the secondary side of transformer Tr in a secondary coil w 3, this voltage subsequently being modified further for feeding to the relay circuit 14 according to FIG. 4.

If the proximity switch 8 is now damped, for example, at a moment t by a metal part M brought close enough to the proximity switch a static signal of a low level will result at its output while the changes in potential at the collectors of transistors T 10 and T 13 according to FIG. 5b also stop and a static signal of a high level occurs. If this static condition continues for a longer period of time the transistor T 12 could become thermally overloaded because the current flowing through this transistor is only limited by the slight direct-current resistance of the coil portion w 1. Transistor T 12 must therefore be switched off by a function of time which, in the case of the embodiment, occurs in such a way that capacitor C 6 is charged via resistors R 22 and R 23 according to an exponential function until a voltage is reached which suffices to switch the transistor T 11 into a conductive state via the tab of the voltage divider R 24, R 25. As soon as this occurs the base of transistor T 12 is changed over to the potential OV so that transistor T 12 is rendered non-conductive. The structural elements C 6, R 23, R 24 and R 25 are dimensioned such that the transistor T 12 is cut off or rendered non-conductive according to a time interval a, as clearly shown in FIG. 5c which illustrates the voltage variation across the capacitor C 6. It can be seen that the duration of the time interval a corresponds approximately to twice the pulse duration of the dynamic output signal from the proximity switch.

If input E of the evaluating circuit 9 with the actuating circuit 12, the transformer Tr and the relay circuit 14 is inadvertently connected to the positive operating voltage a thermal overloading of transistor T 13 may take place in a corresponding way. For this reason the PTC resistor R 29 is inserted into the connection to be connected to the positive supply voltage $+U_B$. The activation time of the PTC resistor is approximately 3 to 4 sec. when a coil portioned w 1 or w 2 of the primary coil of transformer Tr constantly has a direct current flowing through it and the direct current is proportion such that the switching transistor T 13 and the transformer Tr are protected against any intolerable heating.

When, following damping or a fault, which may for example be caused by a short-circuit in the wires of the circuit connecting the proximity switch to the actuating circuit, by the output transistor T 6 of the proximity switch short-circuiting or by the poles being interchanged, a few pulses of the output signal are again generated the PTC resistor R 29 must first of all be cooled during a time interval of about 30 to 40 seconds until the circuit can recommence normal operations. Moreover, the voltage variation at the collector of transistor T 12 is illustrated in FIG. 5d, the voltage variation at the secondary side of transformer Tr in FIG. 5e.

As shown in FIG. 4 the connections of the secondary coil w 3 of transformer Tr are connected to a bridge rectifier B, via which the relay circuit 14 is fed. The positive output connection of the bridge rectifier B is connected to one connection of a first relay Rel 1, the second connection of which is connected to the negative connection of the rectifier B via normally closed contacts 2d and 2c of a second relay Rel 2. The second connection of relay Rel 1 may also be connected to this negative connection via one of its normally open contacts 1f. The series connection of a normally closed contact 1e of the first relay Rel 1, a resistor R 30 and a capacitor C 9 is also located between the output connections of the bridge rectifier B.

The first connection of the second relay Rel 2 is also connected to the positive output of the bridge rectifier B while the second connection of the second relay Rel 2 is connected to the negative output of the bridge rectifier B via the switching circuit of a thyristor Th. The control electrode of the thyristor Th is connected on the one hand to the negative connection of the bridge rectifier B via resistor R 32 and on the other hand via the series connection of a resistor R 31 and a normally open contact 1d of the first relay Rel 1 to the connection point of resistor R 30 and capacitor C 9. A diode D 11 or D 12 for forming a path for the induced voltage is located parallel to each of the two relays Rel 1, Rel 2 while the two output connections of the bridge rectifier B are connected to each other via a capacitor C 8 which serves to stabilize the output voltage of the bridge rectifier.

The preceding description of the structure of relay circuit 14 on the basis of FIG. 4 shows clearly that the electrical energy required to operate the relay circuit may only be obtained from the secondary coil w 3 of transformer Tr. This presupposes that the primary coil w 1, w 2 has a current flowing through it which is continually changing its direction. Only in this case is an alternating magnetic field generated by the primary coil, this alternating magnetic field resulting in an alternating voltage in the secondary coil w 3. Direct voltage signals on the primary side of transformer Tr may not, however, irrespective of their voltage level, lead to a constant activation of relays Rel 1 and Rel 2 of the relay circuit 14.

In principle, it would suffice to actuate a single relay with the rectified voltage from the output of transformer Tr or the bridge rectifier B. This relay is activated when the transformer Tr supplies an output voltage and drops out when this voltage stops due to damping of the proximity switch or due to a fault. When, however, in the case of this simple switching concept the contacts of the relay fuse together or stick to the armature due to a mechanical defect no reliable failure indication occurs at the output of the relay circuit. The monitoring means described for the proximity switch itself would therefore be of no use. For this reason two relays Rel 1 and Rel 2 are used according to the invention whereby it is assumed that the case will never occur where both relays have at the same time the type of defect such that their contacts stick to the armature during operation or in an activated condition. The two relays are, according to the invention, not simply connected in parallel since in this case no warning signal could be generated when one of the relays sticks so that in the long run the safety factor would be no greater than that achieved with the use of one relay. On the contrary, the two relays Rel 1 and Rel 2 are connected in the relay circuit 14 according to the invention such that they monitor each other, i.e. in such a way that a failure indication will be triggered even if only one of the two relays sticks; in this case the main contact circuit 16 of the machine control means with the normally open contacts 1a and 2a of relays Rel 1 or Rel 2 will remain interrupted.

The relay circuit 14 according to FIG. 4 operates in detail as follows:

When the circuit is switched in, i.e. when an alternating-current voltage occurs on the secondary side of transformer Tr, this leads to the rectified voltage at the output of the bridge rectifier B first of all activating the relay Rel 1 via the current path with the normally closed contacts 2d and 2c. At the same time, capacitor C 9 is charged via the normally closed contact 1e and resistor R 30 to a potential sufficient for firing the thyristor Th. When the relay Rel 1 is activated after its magnetic field has been built up the contacts of this relay will be actuated accordingly; due to the fact that relay Rel 1 is a relay with positively controlled contact movement the normally closed contacts will be opened first of all and then normally open contacts closed. This means that capcitor C 9 is first of all disconnected from the positive connection of the bridge rectifier B due to opening of the normally closed contact 1e and then connected a short time later to the control electrode of thyristor Th via the normally open contact 1d. When this happens the thyristor Th is fired so that the second relay Rel 2 may also be activated, its normally closed contacts 2c and 2d being opened. As the first relay Rel 1 is in the meantime self-holding via its normally open contact 1f the two normally open contacts 1a and 2a in the main contact circuit 16 of the machine control means are closed and remain closed until the dynamic alternating voltage signal at the output side of transformer Tr ends; this happens when the proximity switch is damped by a metal part M or when one of the faults, which are to be monitored, occurs.

The preceding description makes it clear that a testing and evaluating circuit is created according to the invention which is not only suitable for continual monitoring of the correct functioning of a proximity switch capable of being tested but is also designed such that a self-monitoring of all the essential circuit components of the monitoring circuit may take place by utilizing the dynamic output signal of the proximity switch which is functioning correctly. In this way an extremely high margin of safety is achieved for the clearing and blocking of the machine control means connected to the proximity switch, as shown clearly in the following list of possible faults in the relay circuit, in which the individual elements are merely designated by their reference numerals and the abbreviation MCC is used to designate the main contact circuit 16. It is, in principle, of no importance for realisation of the invention whether the proximity switch operates as a normally closed or normally open switch and whether the proximity switch is normally damped or de-damped or rather activated or not activated.

| Possible Faults in the Relay Circuit | | | | |
|---|---|---|---|---|
| | Effect when Relay | | | |
| Component | sticks to armature in open position | MCC interrupted by | sticks to armature in closed position | MCC interrupted by |
| Rel 1 | Attraction of Rel 2 is prevented as no charging of C9 and therefore no triggering pulse for Th | 2a | Attraction of Rel 2 is prevented as no triggering pulse for Th. Also MCC interrupted by own contact | 1a, 2a |
| Rel 2 | Attraction of Rel 1 is prevented as voltage supply via 2c/2d interrupted | 1a | MCC interrupted by own contact | 2a |

| Contact | Effect when Relay Contact soiled or its wire is interrupted | MCC interrupted by |
|---|---|---|
| 1a | MCC is interrupted | 1a |
| 1d | No triggering pulse for Th, attraction of Rel 2 prevented | 2a |
| 1e | No charging of C9, therefore no triggering pulse for Th, attraction of Rel 2 prevented | 2a |
| 1f | Self-holding of Rel 1 prevented, drops out immediately | 1a |
| 2a | MCC is interrupted | 2a |
| 2c/2d | Attraction of Rel 1 prevented, therefore also attraction of Rel 2 | 1a, 2a |

| | Effect when Component | | | |
|---|---|---|---|---|
| Component | = 0 Ω (Short-circuited) | MCC interrupted by | = ∞ Ω (detached or burnt out) | MCC interrupted by |
| Th 1 | Rel 2 activated immediately and interrupts with 2c/2d voltage supply for Rel 1 | 1a | Attraction of Rel 2 prevented | 2a |
| D 11 | Attraction of Rel 1 prevented, therefore also of Rel 2 | 1a, 2a | No immediate effect. In long run possible damage to 1f | — |
| D 12 | Attraction Rel 2 prevented | 2a | No direct effect | — |
| R 30 | No direct effect | — | No triggering current for Th, attraction Rel 2 prevented | 2a |
| R 31 | No immediate effect; in long run Th destroyed | — | No triggering current for Th, attraction Rel 2 prevented | 2a |
| R 32 | Triggering current for Th diverted, attraction of Rel 2 prevented | 2a | No direct effect | — |
| B | Insufficient supply voltage | (1a, 2a) | Insufficient supply voltage | (1a, 2a) |
| C 8 | Short-circuit supply voltage | 1a/2a | Supply voltage periodically down to 0. No holding current for Th | 2a |
| Trafo | Short-circuit between windings or coils results in inadequate or no supply voltage (Short-circuit of primary to secondary coil prevented by structural design) | 1a, 2a | Interruption in one coil results in half or no supply voltage | 1a, 2a |

We claim:

1. A testing and monitoring circuit for a proximity switch forming an element of a machine control means including in combination, a proximity switch alternately switchable between two operating conditions, control circuit means for switching said proximity switch between its two operating conditions to generate a timed output signal with a given frequency and monitoring circuit means responsive to said proximity switch and to said control circuit means for producing a clear signal for the duration of said timed output signal and a blocking signal for the machine control means in the absence of changes in the potential of the output signal from the proximity switch.

2. A circuit as in claim 1 in which said evaluating circuit comprises a relay circuit and means including a transformer for coupling said proximity switch to said relay circuit.

3. Circuit according to claim 2, characterized in that the evaluating circuit (9) has an actuating circuit (12) between the output (A) of the proximity switch (8) and the transformer (Tr).

4. Circuit according to claim 3, characterized in that the actuating circuit (12) has amplifier means (18, 20) for the output signal from the proximity switch (8) and blocking means (T 11; R 29) to protect the transformer (Tr) from overloading in the absence of changes in the potential of the output signal from the proximity switch (8).

5. Circuit according to claim 1, characterized in that the relay circuit (14) contains two relays (Rel 1, Rel 2) each having a normally open contact (1a, 2a) and that the normally open contacts (1a, 2a) are inserted in series to each other into a main contact circuit (16) of the machine control means.

6. Circuit according to claim 4, characterized in that the blocking means of the actuating circuit (12) include a switching transistor (T 11), which is switchable by delayed action via a timing element (R 23, C 6) to block a current flowing to the transformer (Tr) at a first potential of the output signal from the proximity switch (8) and that the blocking means comprise in addition a PTC resistor (R 29), which becomes effective by delayed action at a second potential of the output signal from the proximity switch (8) to block a current flowing through the transformer (Tr).

7. A circuit according to claim 5 including a capacitor charged by the output current from said transformer, a controllable semiconductor rectifier, said first relay having a normally open contact for connecting said capacitor to said control electrode as triggering pulse source, and means connecting said rectifier in the feeding circuit of the second relay.

8. Testing and evaluating circuit for a proximity switch comprising an oscillator with an inductive or capacitive control element variable in its impedance due to the approach of an element to be monitored and electric testing means, which, for testing the correct functioning of the proximity switch, have a damping circuit, which is electrically and periodically switchable for test purposes and with the aid of which the oscillator is dampable, according to claim 1, characterized in that the control circuit has an astable multivibrator (10) to actuate the damping circuit (T 7, R 14).

9. Circuit according to claim 8 for a proximity switch comprising an inductive feeler head, said feeler head containing a feeler coil with tab, in the oscillatory circuit of the oscillator, characterized in that a short-circuiting of a coil portion (L 1) of the feeler coil (L) is initiated by the multivibrator (10), said coil portion being disposed between the tab and one of the outer connections.

10. Circuit according to claim 9, characterized in that a short-circuiting of the feeler coil (L) or its coil portion (L 1) is directly initiated by a switching transistor (T 7) connected in parallel thereto and adapted to be controlled by the multivibrator (10).

11. Circuit according to claim 10, characterized in that a predetermined series resistor (R 14) is inserted in the short-circuiting means.

12. Circuit according to claim 11, characterized in that the collector of the switching transistor (T 7) is connected to the tab of the feeler coil (L), that the emitter of the switching transistor (T 7) is connected to an outer connection (3) of the feeler coil (L), said outer connection being connected to one terminal (OV) of a power source, and that the base of the switching transistor (T 7) is connected to the output of the multivibrator (10).

13. Testing and evaluating circuit for an optical proximity switch having a light transmitter according to claim 1, characterized in that the light transmitter of the proximity switch is adapted to be switched on and off by the control circuit with a given frequency.

* * * * *